(12) United States Patent
Shimada et al.

(10) Patent No.: US 7,655,974 B2
(45) Date of Patent: Feb. 2, 2010

(54) SEMICONDUCTOR DEVICE

(75) Inventors: Satoru Shimada, Hashima (JP);
Yoshikazu Yamaoka, Ogaki (JP);
Kazunori Fujita, Yoro-gun (JP);
Tomonori Tabe, Anpachi-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/829,310

(22) Filed: Jul. 27, 2007

(65) Prior Publication Data

US 2008/0023787 A1 Jan. 31, 2008

(30) Foreign Application Priority Data

Jul. 28, 2006 (JP) .............................. 2006-206891

(51) Int. Cl.
*H01L 29/76* (2006.01)
(52) U.S. Cl. ...................................... 257/330; 438/270
(58) Field of Classification Search ................. 438/268, 438/270, 272, 273; 257/173, 328–331, 355, 257/356, 341, 342, E29.335, E29.131
See application file for complete search history.

(56) References Cited

U.S. PATENT DOCUMENTS

| 4,819,052 A * | 4/1989 | Hutter ........................ 257/378 |
| 6,459,142 B1* | 10/2002 | Tihanyi ...................... 257/621 |
| 2004/0232522 A1* | 11/2004 | Shimizu ...................... 257/548 |

FOREIGN PATENT DOCUMENTS

JP  2003-303960  10/2003

* cited by examiner

*Primary Examiner*—David Vu
(74) *Attorney, Agent, or Firm*—Ditthavong, Mori & Steiner, P.C.

(57) ABSTRACT

A semiconductor device that reduces the width of an isolation region between semiconductor elements. The semiconductor device includes a semiconductor substrate, an epitaxial layer formed on the semiconductor substrate, a buried layer formed between the semiconductor substrate and the epitaxial layer, a first trench formed in the epitaxial layer so as to surround the buried layer, and an insulation film formed in the first trench.

10 Claims, 9 Drawing Sheets

SEMICONDUCTOR DEVICE

CROSS-REFERENCE TO RELATED APPLICATIONS

This application is based upon and claims the benefit of priority from the prior Japanese Patent Application No. 2006-206891, filed on Jul. 28, 2006, the entire contents of which are incorporated herein by reference.

BACKGROUND OF THE INVENTION

The present invention relates to a semiconductor device, and more particularly, to a semiconductor device that is advantageous for element isolation.

Techniques for integrating a control circuit with a plurality of power transistors on the same semiconductor substrate have been developed for electronics devices such as portable devices and home appliances.

FIG. 1 is a schematic cross-sectional view of a vertical N-channel MOS (metal oxide semiconductor) transistor 300 described in Japanese Laid-Open Patent Publication No. 2003-303960. An epitaxial layer 33 is formed on a monocrystalline silicon substrate 32. Ion implantation and thermal diffusion are performed to form a diffusion buried layer 34 at the interface between the substrate 32 and the epitaxial layer 33. The epitaxial layer 33 includes a trench groove 39 extending in the depthwise direction of the epitaxial layer 33. A drain lead elect-rode 41 is formed in the trench groove 39 with an insulation film 38 arranged therebetween. The drain lead electrode 41 is electrically connected to the buried layer 34 and made of polycrystalline silicon. The epitaxial layer 33 further has a source region 45 and a channel region 44, which are formed through double diffusion. Gate electrodes 48 are formed to extend through the source region 45 and the channel region 44 with insulation films 47 arranged therebetween.

A plurality of semiconductor elements having the above-described structure are arranged on a semiconductor substrate. The semiconductor elements are electrically isolated from one another by a first isolation region 50 and a second isolation region 51. The first isolation region 50 is formed through ion implantation and thermal diffusion at the interface between the substrate 32 and the epitaxial layer 33. The second isolation region 51 is formed through ion implantation and thermal diffusion to extend from the surface of the epitaxial layer 33 to the first isolation region 50.

When voltage is applied to the gate electrodes 48, a conductive channel is formed in the channel region 44. Carriers of the MOS transistor 300 are electrons, which move from the source region 45, the channel region 44, the epitaxial layer 33, the buried layer 34, and to the drain lead electrode 41.

When current flows through the MOS transistor 300 shown in FIG. 1, leak current may leak into an adjacent element from a current flow path. This is referred to as a punch-through phenomenon. To improve the element breakdown voltage, that is, the insulation resistance required for element isolation, the isolation regions 50 and 51 must have a greater width in the lateral direction (the direction parallel to the surface of the semiconductor substrate). That is, the isolation regions 50 and 51 must have a greater diffusion width. For this reason, it is difficult to reduce the size of a semiconductor device.

SUMMARY OF THE INVENTION

The present invention provides a semiconductor device that reduces the width of an isolation region between semiconductor elements.

One aspect of the present invention is a semiconductor device including a semiconductor substrate, an epitaxial layer formed on the semiconductor substrate, a buried layer formed between the semiconductor substrate and the epitaxial layer, a first trench formed in the epitaxial layer to surround the buried layer, and an insulation film formed in the first trench.

Another aspect of the present invention is a semiconductor device including a semiconductor substrate, an epitaxial layer formed on the semiconductor substrate, a buried layer formed between the semiconductor substrate and the epitaxial layer, a first trench extending through the epitaxial layer and surrounding the buried layer, an insulation film formed in the first trench, a second trench extending through the epitaxial layer to the buried layer, and a conductor formed in the second trench and connected to the buried layer.

A further aspect of the present invention is a method for manufacturing a semiconductor device. The method includes preparing a semiconductor substrate having a surface, introducing an impurity into the surface of the semiconductor substrate to form a buried layer, forming an epitaxial layer on the semiconductor substrate above the buried layer, forming a first trench surrounding the buried layer on the epitaxial layer, and forming an insulation film in the first trench.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
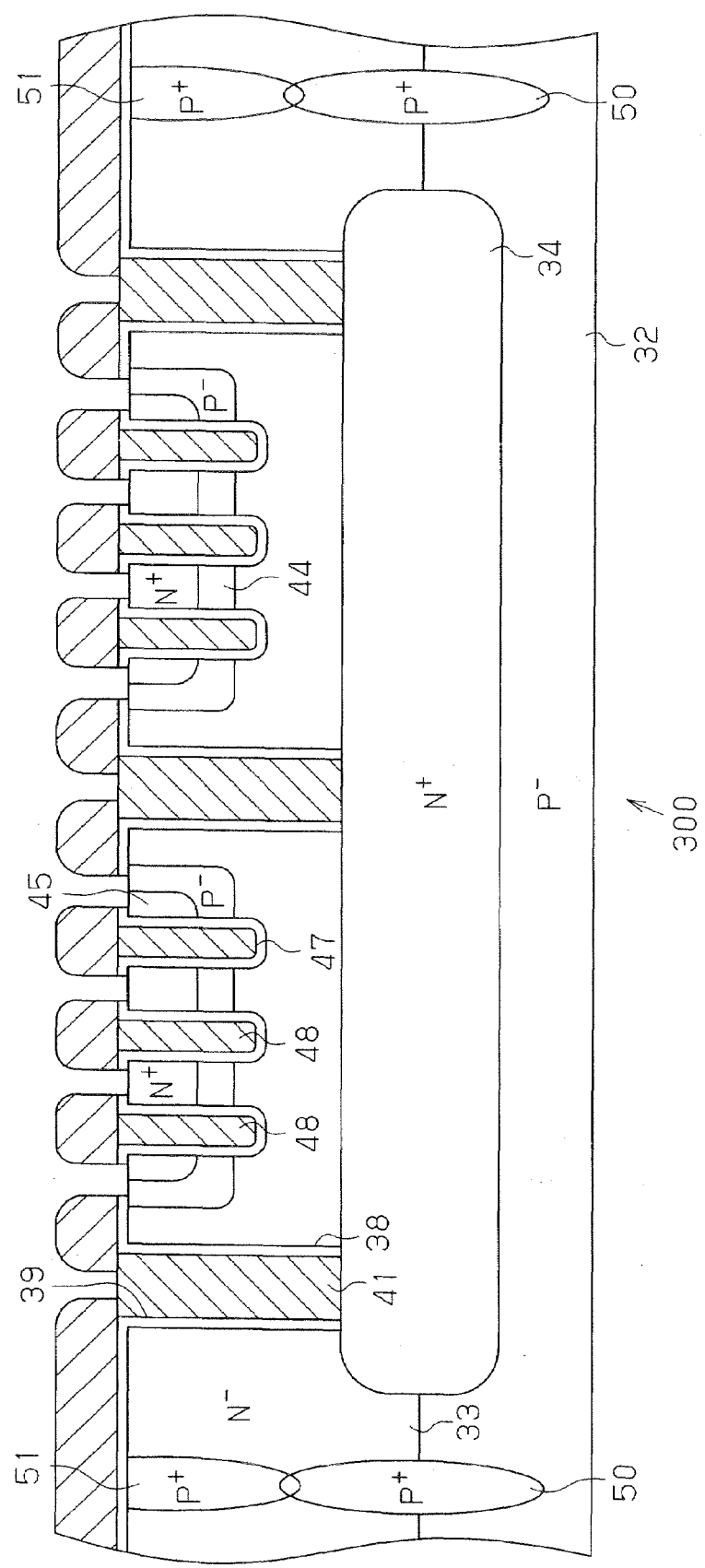
FIG. 1 is a schematic cross-sectional view of a prior art semiconductor device.

In the drawings, like numerals are used for like elements throughout.

A semiconductor device according to a first embodiment of the present invention will now be described with reference to FIGS. 2 to 13.

Figure 2:
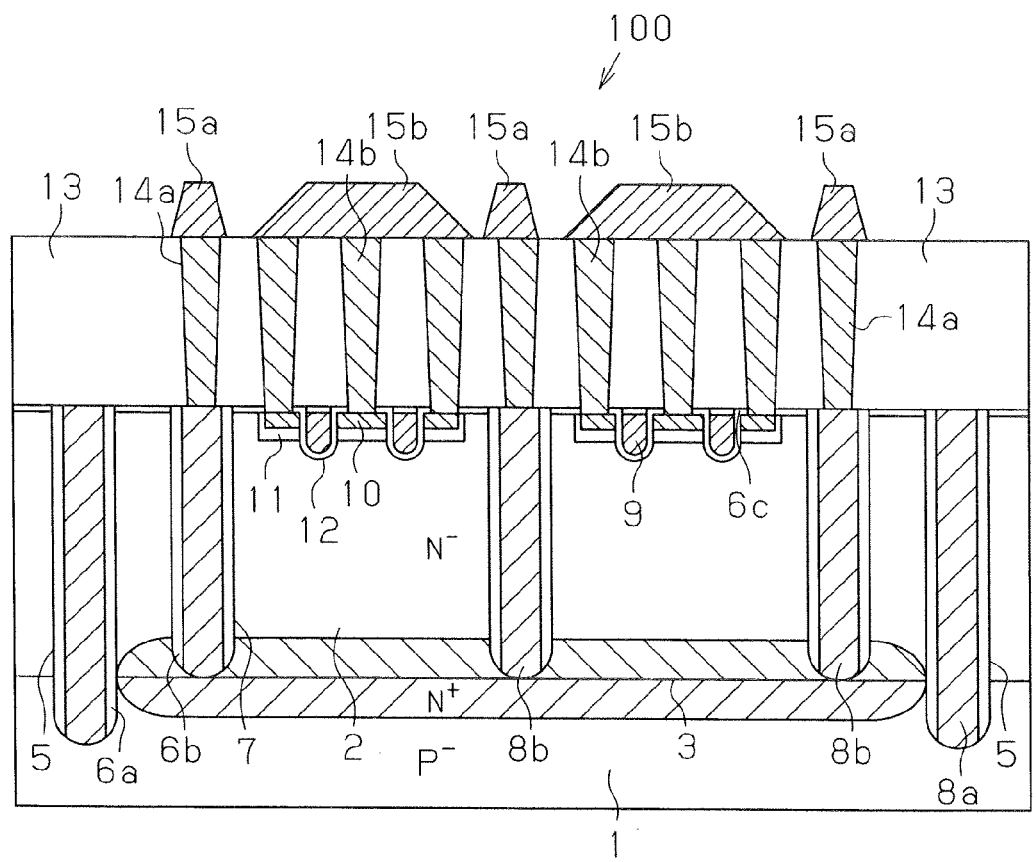
FIG. 2 is a schematic cross-sectional view of a semiconductor device according to a first embodiment of the present invention.
Figure 3:
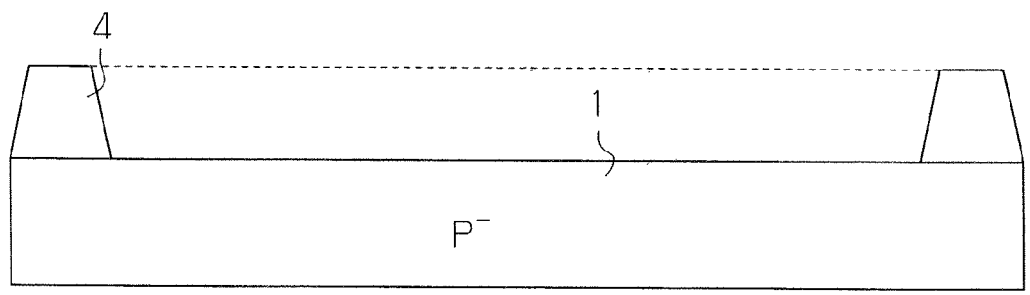
FIG. 3 is a schematic cross-sectional view showing a process for manufacturing the semiconductor device of FIG. 1.
Figure 4:
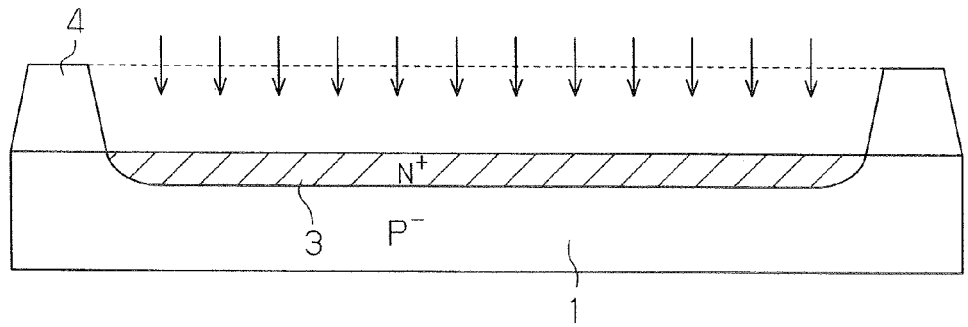
FIG. 4 is a schematic cross-sectional view showing a process for manufacturing the semiconductor device of FIG. 1.
Figure 5:
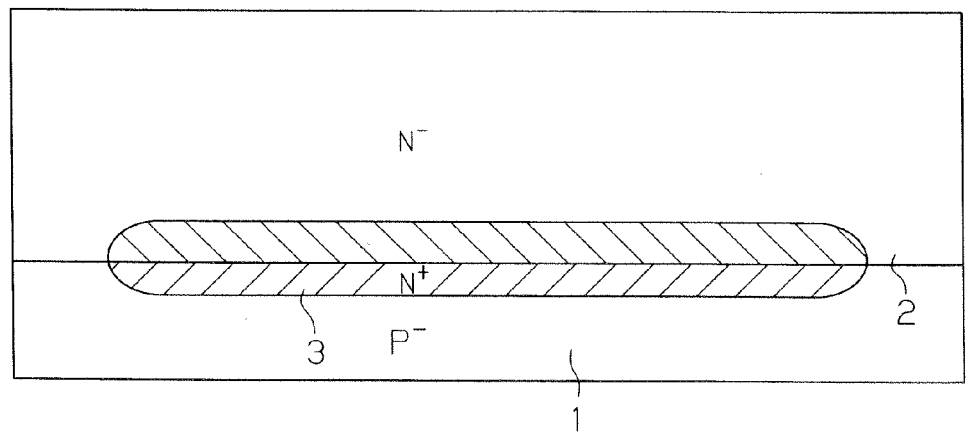
FIG. 5 is a schematic cross-sectional view showing a process for manufacturing the semiconductor device of FIG. 1.
Figure 6:
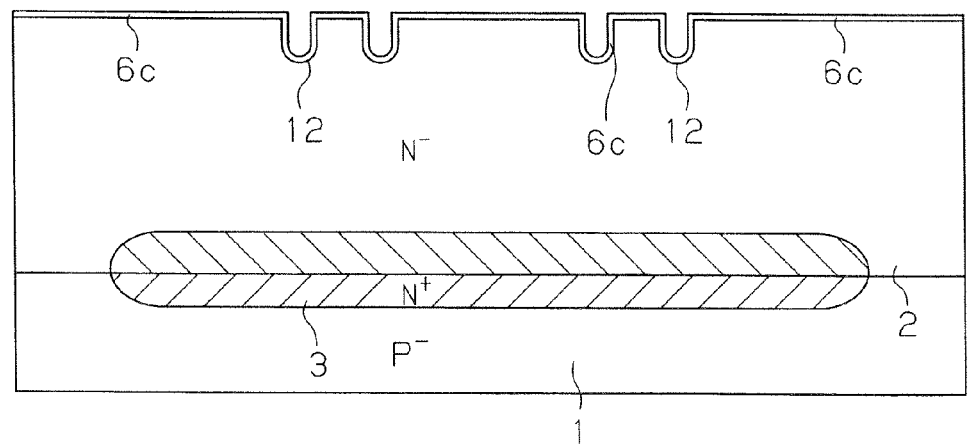
FIG. 6 is a schematic cross-sectional view showing a process for manufacturing the semiconductor device of FIG. 1.
Figure 7:
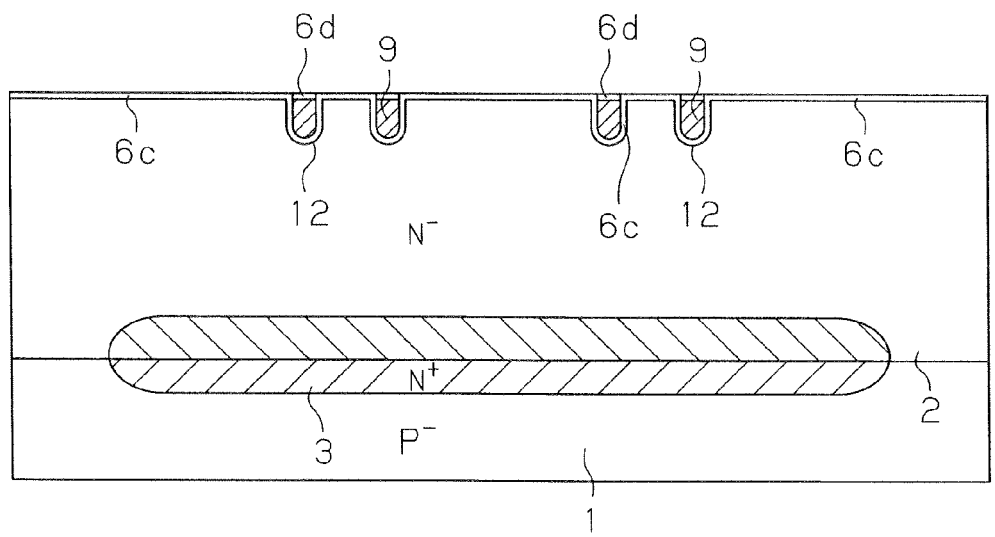
FIG. 7 is a schematic cross-sectional view showing a process for manufacturing the semiconductor device of FIG. 1.
Figure 8:
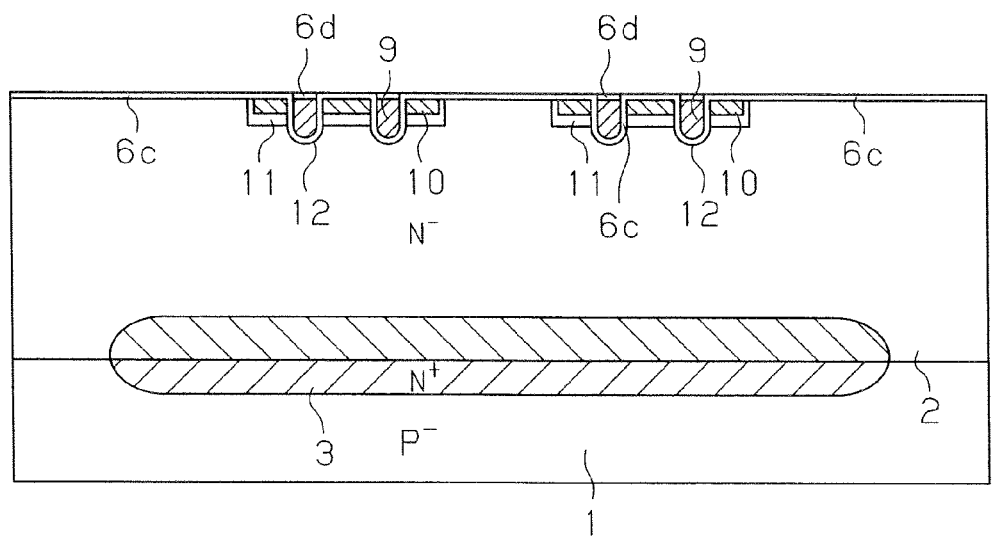
FIG. 8 is a schematic cross-sectional view showing a process for manufacturing the semiconductor device of FIG. 1.
Figure 9:
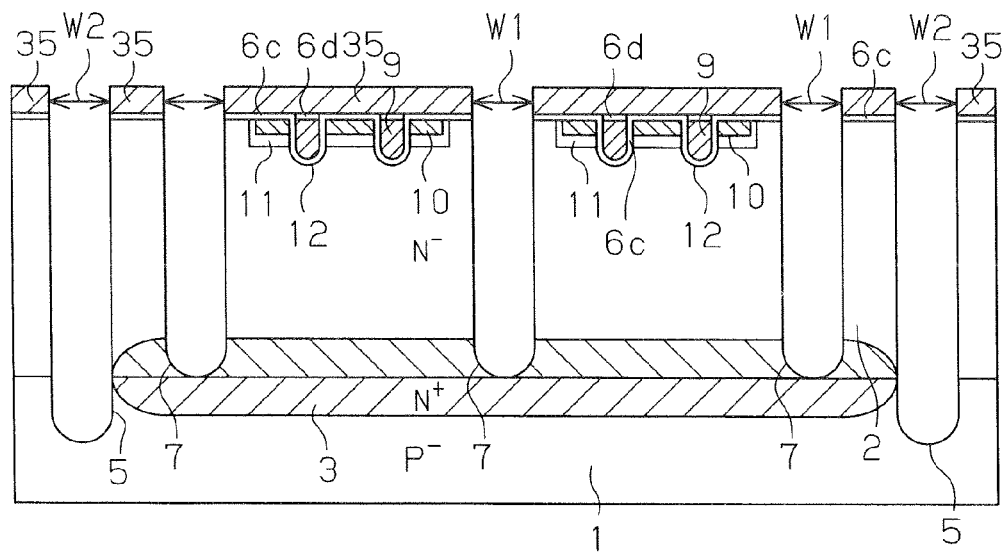
FIG. 9 is a schematic cross-sectional view showing a process for manufacturing the semiconductor device of FIG. 1.
Figure 10:
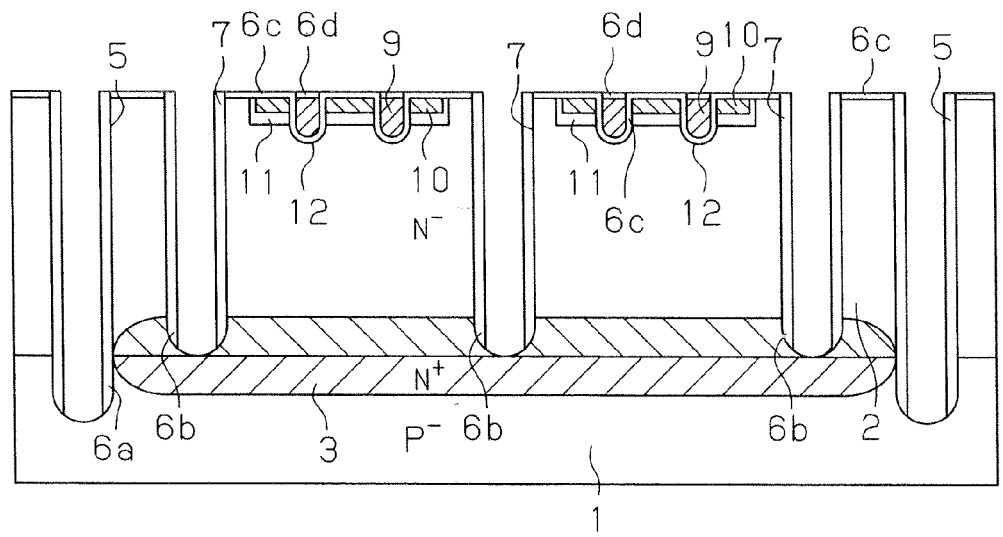
FIG. 10 is a schematic cross-sectional view showing a process for manufacturing the semiconductor device of FIG. 1.
Figure 11:
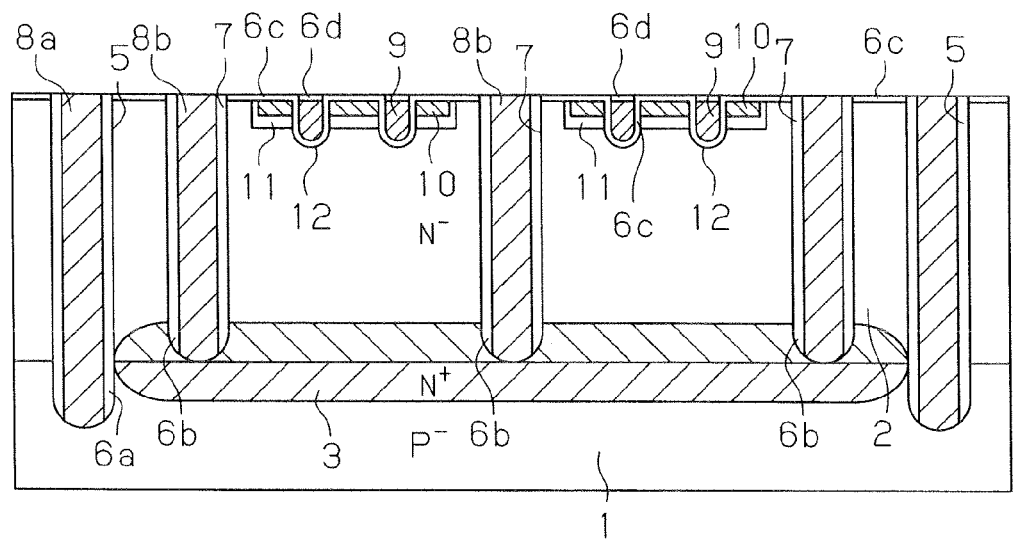
FIG. 11 is a schematic cross-sectional view showing a process for manufacturing the semiconductor device of FIG. 1.

The structure of the semiconductor device of the first embodiment will first be described in detail. FIG. 2 is a schematic cross-sectional view of a vertical N-channel MOS transistor 100.

An epitaxial layer 2 is formed on a monocrystalline silicon substrate 1. A buried layer 3 is formed at the interface between the substrate 1 and the epitaxial layer 2. The epitaxial layer 2 has a trench 5 extend from the surface of the epitaxial layer 2 into the substrate 1. The trench 5 surrounds the buried layer 3. The MOS transistor 100 is formed in an island region defined by the trench 5. Although FIG. 2 shows only one island region, a plurality of island regions are defined by a plurality of trenches 5 in the actual structure. An insulation film 6a (e.g., a silicon oxidation film), which insulates between the trench 5 from the epitaxial layer 2 and from the substrate 1 covers the inner side surface of the trench 5. An isolation trench 8a, which is formed by a conductor, is filled in the trench 5.

The epitaxial layer 2 further includes trenches 7 extending from the surface of the epitaxial layer 2 to the buried layer 3. An insulation film 6b (e.g., a silicon oxidation film) covers an inner side surface of each trench 7. The insulation film 6b insulates the trench 7 and the epitaxial layer 2. A drain lead electrode 8b, which is formed by a conductor, is filled in the trench 7. The drain lead electrode 8b is electrically connected to the buried layer 3. Examples of the conductors forming the isolation trench 8a and the drain lead electrode 8b include metal layers of, for example, tungsten and polycrystalline silicon containing impurities.

The epitaxial layer 2 further includes channel regions 11 and source regions 10, which are formed through double diffusion. Further, the epitaxial layer 2 includes a plurality of trenches 12 for forming gate electrodes 9. The trenches 12 are formed to be deep enough to extend through the channel region 11 and the source region 10 but not the buried layer 3. A gate oxidation film 6c covers an inner side surface and an inner bottom surface of each trench 12. A gate electrode 9 is formed in each trench 12 with the gate oxidation film 6c arranged therebetween. The gate electrodes 9 are made of polysilicon containing an n-type impurity, such as phosphorous (P). The gate oxidation film 6c is formed by, for example, a silicon oxidation film.

An insulation layer 13 is formed on the epitaxial layer 2. Contact plugs 14a and 14b are buried in the insulation layer 13. Drain electrodes 15a and source electrodes 15b are formed on the insulation layer 13. The drain electrodes 15a and source electrodes 15b are each made of, for example, tungsten or aluminum (Al). Each drain electrode 15a is connected via a contact plug 14a to the corresponding drain lead electrode 8b in a trench 7. Each source electrode 15b is connected via a contact plug 14b to the corresponding source region 10.

In the MOS transistor 100 with the above-described structure, the epitaxial layer 2 functions as a drift region. Voltage is applied to the drain electrode 15a and the source electrode 15b so that the potential at the drain electrode 15a is higher. Predetermined voltage is applied to the gate electrodes 9. As a result, current flows from the drain electrodes 15a to the source electrodes 15b.

A method for manufacturing the MOS transistor 100 will now be described with reference to FIGS. 3 to 13.

Process 1 (refer to FIG. 3): A silicon substrate 1 is thermally oxidized to form a silicon oxidation film 4 on an upper surface of the silicon substrate 1. As indicated by a broken line in FIG. 3, a portion of the silicon oxidation film 4 is removed by performing photolithography and wet etching.

Process 2 (refer to FIG. 4): N-type impurities including antimony (Sb) are applied in a region from which the portion of the silicon oxidation film 4 has been removed in process 1. The n-type impurities are applied by performing spin coating in a direction indicated by the arrows in FIG. 4. The silicon substrate 1 is then subjected to heat treatment. This forms a buried layer 3. The silicon oxidation film 4 is subsequently removed.

Process 3 (refer to FIG. 5): An epitaxial layer 2 is grown on the substrate 1 with an epitaxial growing device. The heat treatment performed to grow the epitaxial layer 2 diffuses the buried layer 3 into the epitaxial layer 2 on the substrate 1. As a result, the buried layer 3 is formed at the interface between the substrate 1 and the epitaxial layer 2.

Process 4 (refer to FIG. 6): Trenches 12 are formed in the epitaxial layer 2 by performing photolithography and etching. Afterwards, the epitaxial layer 2 is thermally oxidized to form a gate oxidation film 6c on an upper surface of the epitaxial layer 2.

Process 5 (refer to FIG. 7): Polysilicon is deposited in the trenches 12. Then, heat treatment is performed to dope polysilicon with phosphorous (P). Afterwards, the polysilicon is etched back to form gate electrodes 9. The gate electrodes 9 are then thermally oxidized to form oxidation films 6d on upper surfaces of the gate electrodes 9.

Process 6 (refer to FIG. 8): A resist mask having an opening corresponding to the location of channel regions 11 is formed on the oxidation films 6c and 6d. A p-type impurity, for example, boron (B), is ion implanted in the epitaxial layer 2 and diffused. This forms the channel region 11.

A resist mask having an opening corresponding to the location of source regions 10 is formed on the oxidation films 6c and 6d. An n-type impurity, for example, arsenic (As), is ion implanted into the epitaxial layer 2 and then diffused. This forms the source regions 10 in the channel regions 11 through double diffusion.

Process 7 (refer to FIG. 9): A silicon nitride film 35 is deposited over substantially the entire surfaces of the oxidation films 6c and 6d. The silicon nitride film 35 is selectively removed by performing photolithography and etching in a manner that openings are formed in the silicon nitride film 35 at locations where the trenches 7 and 5 are to be formed. More specifically, portions of the silicon nitride film 35 are removed so that an opening for a trench 7 has width W1 and an opening for a trench 5 has width W2, which is greater than width W1. Afterwards, dry etching is performed to simultaneously form the trenches 7 and 5. The etching is performed so that the bottom surface of each trench 7 is located in the buried layer 3 and the bottom surface of each trench 5 is located at a position lower than the bottom surface of the buried layer 3. This forms the trenches 5 surrounding the buried layer 3. Since the width W2 is greater than the width W1, the trenches 5 become deeper than the trenches 7. In the first embodiment, the width W2 is adjusted to form the bottom surface of the trench 5 at a position lower than the bottom surface of the buried layer 3.

Process 8 (refer to FIG. 10): A silicon oxidation film (SiO2) is deposited in the trenches 7 and 5 using the silicon nitride film 35 formed in process 7. Afterwards, dry etching is performed using the silicon nitride film 35 as a mask. This removes portions of the silicon oxidation film facing the inner bottom surfaces of the trenches 7 and 5. Further, an insulation film 6b covering an inner side surface of each trench 7 and an insulation film 6a covering an inner side surface of each trench 5 are formed. Afterwards, the silicon nitride film 35 is removed.

Process 9 (refer to FIG. 11): Polycrystalline silicon is deposited in the trenches 7 and 5. The deposited polycrystalline silicon is etched back. This forms drain lead electrodes 8b and isolation trenches 8a. An n-type impurity, such as phosphorous, is implanted in the polycrystalline silicon.

Process 10 (refer to FIG. 12): An insulation layer 13 is deposited on the epitaxial layer 2. Contact holes are formed in the insulation layer 13 by performing photolithography and etching. Tungsten (W) is deposited in the contact holes and then etched back. This forms contact plugs 14a and 14b electrically connected to the drain lead electrodes 8b and the source region 10, respectively.

Process 11 (refer to FIG. 2): Drain electrodes 15a and source electrodes 15b electrically connected to the contact plugs 14a and 14b, respectively, are formed on the insulation layer 13. The drain electrode 15a and the source electrode 15b are made of a metal material, such as aluminum.

In the first embodiment, the substrate 1 corresponds to a semiconductor substrate of the present invention, the epitaxial layer 2 corresponds to an epitaxial layer of the present invention, the buried layer 3 corresponds to a buried layer of the present invention, the trench 5 corresponds to a first trench of the present invention, the isolation trench 8a corresponds to a first conductor of the present invention, the trench 7 corresponds to a second trench of the present invention, the drain lead electrode 8b corresponds to a second conductor of the present invention, and the insulation film 6a corresponds to an insulation film of the present invention. The portion of the upper surface of the substrate 1 that comes in contact with the epitaxial layer 2 corresponds to a first upper surface of a semiconductor substrate of the present invention, and the portion of the upper surface of the substrate 1 that comes in contact with the bottom surface of the buried layer 3 corresponds to a second upper surface of a semiconductor substrate of the present invention.

The semiconductor device of the first embodiment has the advantages described below.

(1) The insulation film 6a covering the inner side surface of the trench 5 enables isolation between semiconductor elements. The carrier concentration of the insulation film 6a formed from an insulation material is lower than the carrier concentration of the conductive layer for the conventional isolation regions 50 and 51 (FIG. 1) formed through ion implantation. Thus, the insulation film 6a, which has a relatively thin film thickness, achieves high insulation between the semiconductor elements. This structure prevents leak current from flowing between semiconductor elements and causing the punch-through phenomenon to occur. Further, enlargement of the isolation in the lateral direction is suppressed. This enables the size of the semiconductor device to be reduced. Further, insulation with the element isolation may be improved without changing the width of the trench 5 by adjusting the film thickness of the insulation film 6a. This suppresses enlargement of the semiconductor element when increasing the breakdown voltage of the semiconductor element.

(2) The isolation trench 8a is formed in each trench 5 with the insulation film 6a arranged therebetween. The insulation film 6a covering the inner side surface of the trench 5 has a thermal expansion coefficient that differs greatly from the thermal expansion coefficient of the silicon substrate 1 and the epitaxial layer 2. When the temperature rises, the differences in thermal expansion between the substrate 1 and the insulation film 6a and between the insulation film 6a and the epitaxial layer 2 may generate stress between the substrate 1 and the insulation film 6a and between the insulation film 6a and the epitaxial layer 2. The isolation trench 8a functions to absorb such stress. This prevents the epitaxial layer 2 and the substrate 1 from becoming defective due to cracks or the like.

(3) The bottom surface of each trench 5 extends into the substrate 1, on which the epitaxial layer 2 is arranged, to a position lower than the bottom surface of the buried layer 3. Thus, the trench 5 entirely surrounds the buried layer 3 in the depthwise direction of the substrate 1. This prevents leak current from flowing from the buried layer 3 in a direction parallel to the surface of the substrate 1 and prevents the punch-through phenomenon from occurring.

(4) The insulation film 6a formed in each trench 5 isolates semiconductor elements. This eliminates the manufacturing processes of ion implantation and thermal diffusion that are required to form the element isolation regions 50 and 51 in the prior art. This reduces cost and saves time for manufacturing the semiconductor device. Further, the trenches 7 and 5 are simultaneously formed. This eliminates the need of carrying out separate processes for forming the isolation regions (the trench 5 and the insulation film 6a). This further reduces cost and saves time for manufacturing the semiconductor device.

In the prior art MOS transistor 300, when the isolation regions 50 and 51 are formed through ion implantation and thermal diffusion the buried layer 34 is thermally diffused. This increases the thickness of the buried layer 34 in the depthwise direction of the substrate 32. When the thickness of the buried layer 34 increases more than necessary, portions of the epitaxial layer 33 between the gate electrodes 48 and the buried layer 34 and between the channel region 44 and the buried layer 34 do not have sufficient thickness. This lowers the breakdown voltage of the semiconductor element. The manufacturing processes of the present invention do not require heat treatment to form the isolation region and thus prevents the breakdown voltage of the semiconductor element from being lowered.

Figure 12:
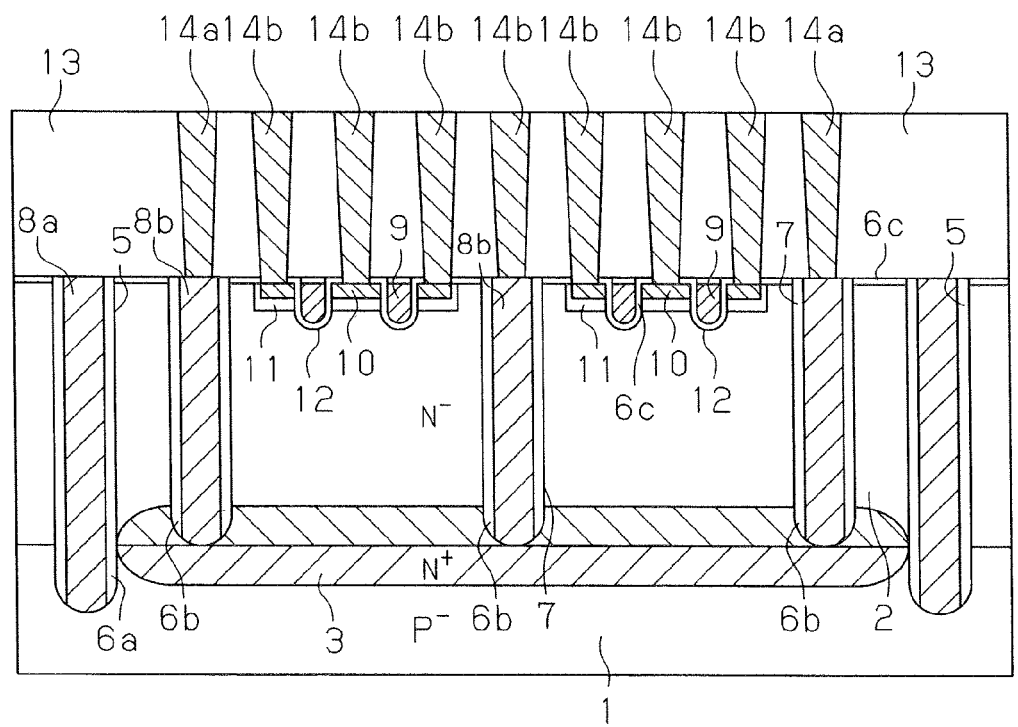
FIG. 12 is a schematic cross-sectional view showing a process for manufacturing the semiconductor device of FIG. 1.
Figure 13:
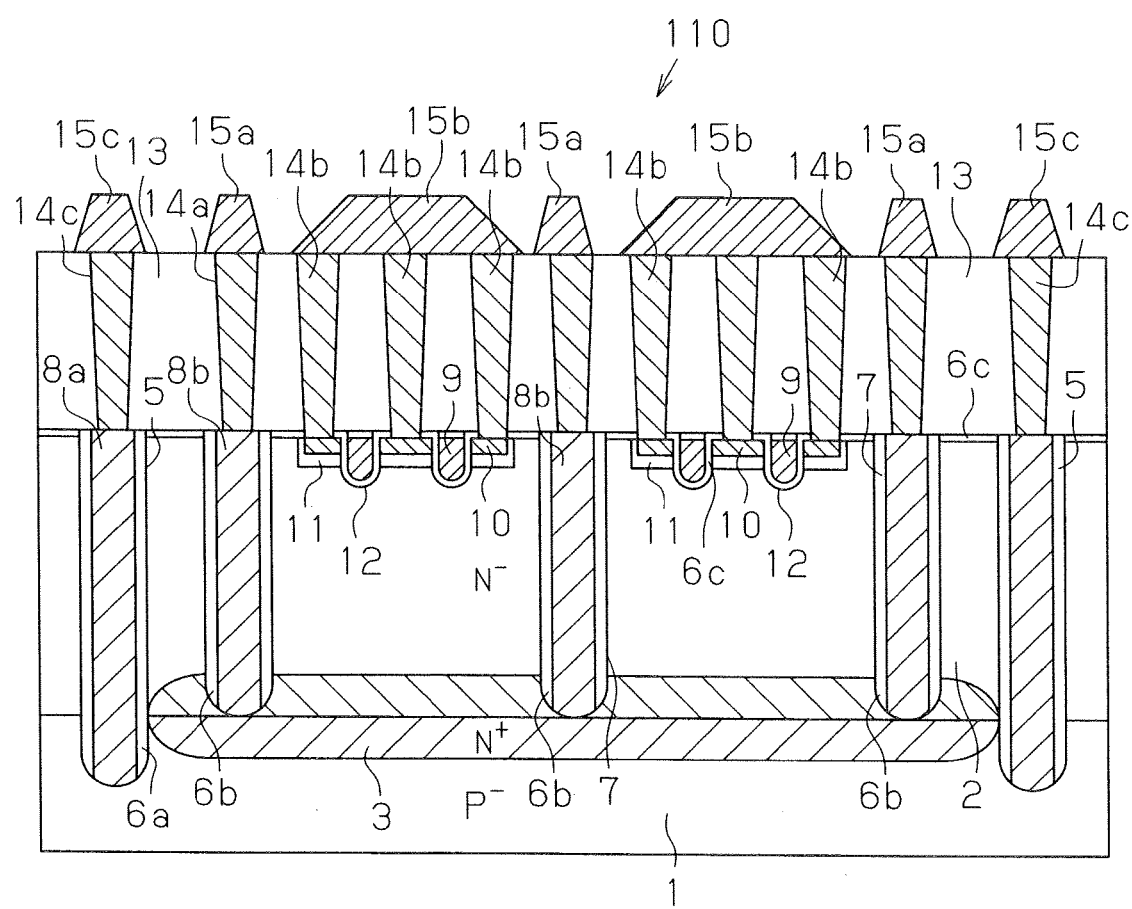
FIG. 13 is a schematic cross-sectional view of a semiconductor device according to another example of the present invention.

FIG. 13 shows a semiconductor device according to another example of the present invention. This semiconductor device is formed by partially changing the structure of the semiconductor device shown in FIG. 2. A MOS transistor 110 having the same structure as the MOS transistor 100 of the first embodiment is formed in an island region surrounded by trenches 5. The semiconductor device shown in FIG. 13 differs from the semiconductor device shown in FIG. 2 in that contact plugs 14c are connected to isolation trenches 8a and isolation trench electrodes 15c are connected to the contact plugs 14c. The contact plugs 14c are formed simultaneously with the contact plugs 14a and 14b in process 10 (FIG. 12). The isolation trench 15c is formed simultaneously with the drain electrodes 15a and source electrodes 15b in process 11 (refer to FIG. 2). The isolation trench electrodes 15c are electrically connected to the substrate 1 via the contact plugs 14c and the isolation trenches 8a.

Predetermined voltage is applied to the isolation trench electrodes 15c. As a result, the potential of the substrate 1 is clamped at the voltage applied to the isolation trench electrode 15c. This suppresses movement of carriers in the substrate 1. Thus, leak current is prevented from flowing through portions of the substrate 1 that are not element-isolated, and the generation of noise between semiconductor elements is suppressed.

A semiconductor device according to a second embodiment of the present invention will now be described with reference to FIGS. 14 to 17. The semiconductor device of the second embodiment is similar to the semiconductor device of the first embodiment. The semiconductor device of the second embodiment differs from the semiconductor device of the first embodiment in that trenches 25 and isolation regions 16 isolate semiconductor elements.

Figure 14:
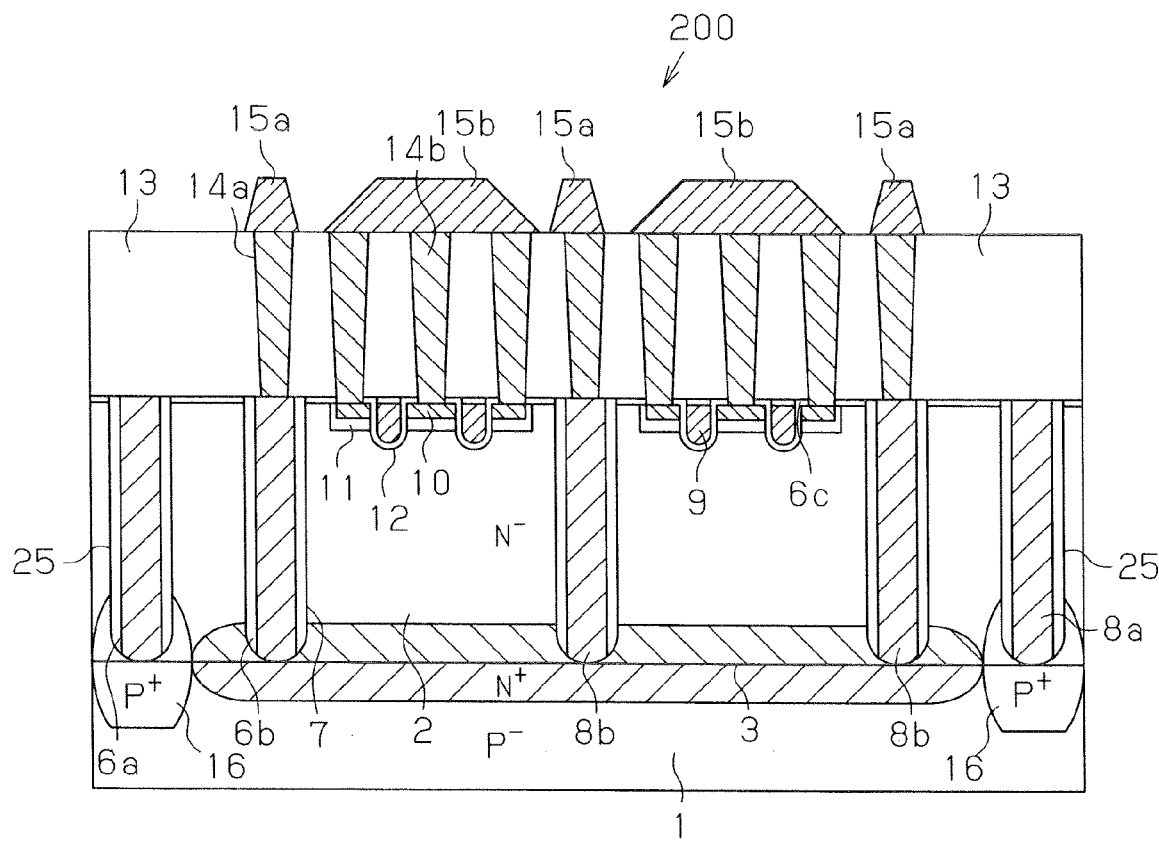
FIG. 14 is a schematic cross-sectional view of a semiconductor device according to a second embodiment of the present invention.

The structure of the semiconductor device of the second embodiment will first be described in detail. FIG. 14 is a cross-sectional view of a vertical N-channel MOS transistor 200.

The isolation regions 16 surrounding a buried layer 3 are formed at the interface between a substrate 1 and an epitaxial layer 2. The isolation regions 16 are formed through ion implantation and thermal diffusion. The isolation regions 16 has a conductivity type that is opposite the conductivity type of the buried layer 3. The isolation region 16 of the second embodiment is one example of an isolation region of the present invention. The epitaxial layer 2 includes trenches 25 extend through the epitaxial layer 2 to the corresponding isolation regions 16. The isolation regions 16 and the trenches 25 define an island region.

Figure 15:
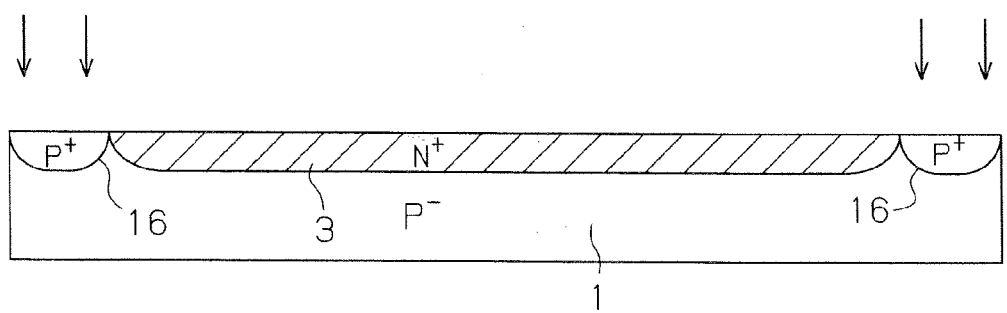
FIG. 15 is a schematic cross-sectional view showing a process for manufacturing the semiconductor device of FIG. 14.
Figure 16:
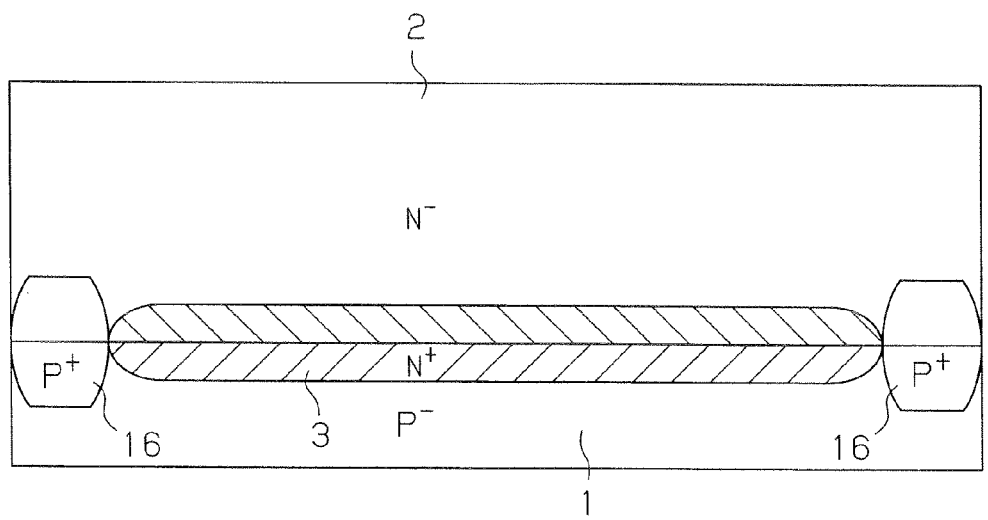
FIG. 16 is a schematic cross-sectional view showing a process for manufacturing the semiconductor device of FIG. 14.
Figure 17:
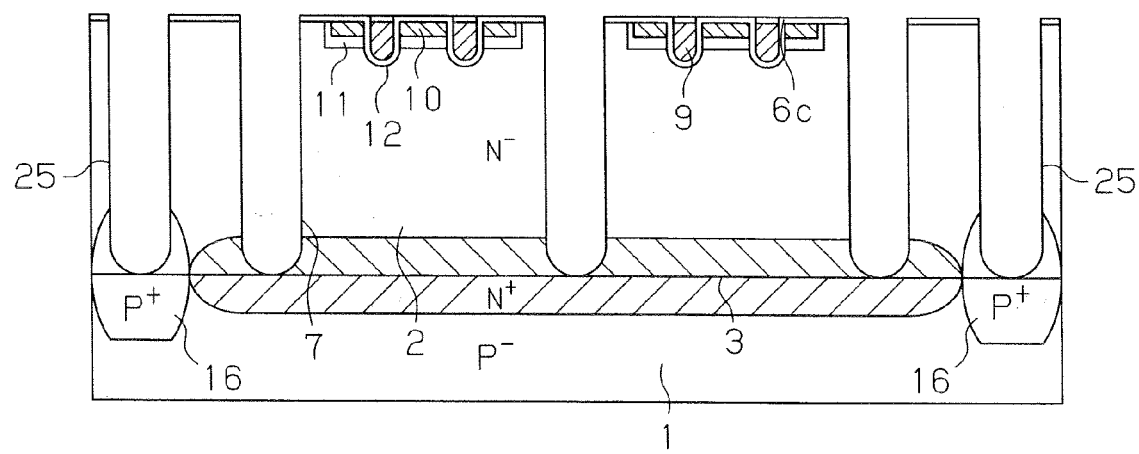
FIG. 17 is a schematic cross-sectional view showing a process for manufacturing the semiconductor device of FIG. 14.

A method for manufacturing the MOS transistor 200 will now be described with reference to FIGS. 15 to 17. Processes differing from the first embodiment will be described.

Process 12 (refer to FIG. 15): A mask (not shown) covering an upper surface of a buried layer 3 is formed by performing photolithography after process 2 in the first embodiment. Boron is ion implanted into an upper surface of a substrate 1 in the direction indicated by the arrows in FIG. 15. The implanted boron is activated by heat treatment. This forms isolation regions 16 that surround the buried layer 3.

Process 13 (refer to FIG. 16): In the same manner as in process 3 of the first embodiment, an epitaxial layer 2 is grown on the substrate 1 using an epitaxial growing device. Heat treatment for growing the epitaxial layer 2 diffuses the buried layer 3 and the isolation regions 16 in the epitaxial layer 2 on the substrate 1. This forms the buried layer 3 and isolation regions 16 at the interface between the substrate 1 and the epitaxial layer 2.

Process 14 (refer to FIG. 17): A silicon nitride film (not shown) is deposited over substantially the entire surfaces of oxidation films 6c and 6d after process 6 of the first embodiment. The silicon nitride film is selectively removed by performing photolithography and etching in a manner that openings are formed at locations where the trenches 7 and 25 are to be formed. More specifically, portions of the silicon nitride film are removed so that the openings for forming the trenches 7 and 25 have the same width. Afterwards, the trenches 7 and 25 are formed simultaneously by performing etching. The etching is performed in a manner that the bottom surface of the trench 7 is located in the buried layer 3 and the bottom surface of each trench 25 is located in the corresponding isolation region 16. Since the openings of the silicon oxidation film for forming the trenches 7 and 25 have the same width, the trenches 7 and 25 have the same depth.

The semiconductor device of the second embodiment has the advantages described below in addition to advantages (1) to (3) of the first embodiment.

(5) Each of the trenches 7 and 25 has a length in the depthwise direction that is proportional to the cross-sectional area of each of the trenches 7 and 25 in the direction perpendicular to the depthwise direction. When the trenches 25 have the same width as the trenches 7, the cross-sectional area of each trench 25 is equal to the cross-sectional area of each trench 7. In the second embodiment, the trenches 25, which extend through the epitaxial layer 2, and the isolation regions 16, which are connected to the trenches 25, surround the buried layer 3 and prevent leak current from flowing so that the punch-through phenomenon does not occur. Thus, the cross-sectional areas of the isolation region 16 and the trench 25 may be adjusted by adjusting the length of the trenches 25 and the length of the isolation regions 16 in the depthwise direction of the substrate 1. This prevents enlargement of the semiconductor element and reduces the size of the semiconductor device.

(6) The isolation regions 16 is formed only at the interface between the epitaxial layer 2 and the substrate 1. This prevents the thickness of the buried layer 3 from increasing more than necessary when heat treatment is performed to form the isolation regions 16. Thus, the breakdown voltage of the semiconductor element is less decreased than the prior art.

It should be apparent to those skilled in the art that the present invention may be embodied in many other specific forms without departing from the spirit or scope of the invention. Particularly, it should be understood that the present invention may be embodied in the following forms.

(a) Instead of polysilicon, the isolation trench 8a may be formed from a metal material, such as tungsten, aluminum, and tungsten silicide. The drain lead electrode 8b may be formed from polysilicon instead of tungsten (metal material). Polysilicon has high affinity with respect to a semiconductor material. Thus, the use of polysilicon improves the reliability of the semiconductor device. The metal material has a lower electric resistance than polysilicon. Thus, the use of the metal material reduces the drain resistance.

(b) The buried layer 3 is not limited to a layer formed by impurity diffusion and may be formed from other conductive materials. For example, the buried layer may be formed from a metal material, such as tungsten, aluminum, and titanium.

(c) The gate electrodes 9 may be formed after the source region 10 and the channel region 11 are formed in the epitaxial layer 2. This would also obtain the advantages described in the above embodiments.

(d) The drain lead electrode 8b and the isolation trench 8a may be formed by performing, for example, chemical mechanical polishing (CMP), photolithography, or etching instead of performing the etch back method.

(e) The drain lead electrode 8b may be used as the source lead electrode, and the diffusion region (the source region 10) formed in the channel region 11 may be used as the drain region.

(f) In the above embodiments, a plurality of trenches (or trenches 25 and isolation regions 16) define a plurality of islands in an actual structure. A MOS transistor 100, 110, or 200, a vertical P-channel MOS transistor, or a vertical NPN bipolar transistor having the element isolation structure of the present invention may be formed in any of the plurality of islands.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   a semiconductor substrate;
   an epitaxial layer formed on the semiconductor substrate;
   a buried layer formed between the semiconductor substrate and the epitaxial layer;
   a first trench located above the semiconductor substrate and formed in the epitaxial layer to surround the buried layer;
   an insulation film formed in the first trench; and
   an isolation region extending from the semiconductor substrate to the epitaxial layer to connect to the first trench, wherein the buried layer and the isolation region are of different conductivity types,
   wherein the whole first trench is formed above an upper surface of the semiconductor substrate.

2. The semiconductor device according to claim 1, wherein:
   the first trench has an inner side surface and an inner bottom surface; and
   the insulation film is formed on at least the inner side surface of the first trench.

3. The semiconductor device according to claim 1, further comprising:
   a first conductor formed in the first trench.

4. The semiconductor device according to claim 3, wherein the first trench has an inner side surface, which is covered by the insulation film, and an inner bottom surface and the first conductor is electrically connected to the isolation region via the inner bottom surface of the first trench so that the first conductor is electrically connected to the semiconductor substrate via the isolation region, with a predetermined voltage applied to the first conductor.

5. The semiconductor device according to claim 1, further comprising:
   a second trench extending through the epitaxial layer to the buried layer; and
   a second conductor formed in the second trench and connected to the buried layer.

6. The semiconductor device according to claim 5, wherein:
   the first trench has a first opening width; and
   the second trench has a second opening width that is smaller than the first opening width.

7. The semiconductor device according to claim 1, wherein: the buried layer has an upper surface that comes in contact with the epitaxial layer; and
   the first trench has an inner bottom surface that is formed at a position lower than the upper surface of the buried layer.

8. The semiconductor device according to claim 1, wherein:
   the semiconductor substrate has an upper surface that comes in contact with the epitaxial layer; and
   the first trench has an inner bottom surface that extends to the upper surface of the semiconductor substrate.

9. A semiconductor device comprising:
   a semiconductor substrate;
   an epitaxial layer formed on the semiconductor substrate;
   a buried layer formed between the semiconductor substrate and the epitaxial layer;
   a first trench extending through the epitaxial layer and surrounding the buried layer;
   an insulation film formed in the first trench;
   a second trench extending through the epitaxial layer to the buried layer; and
   a conductor formed in the second trench and connected to the buried layer, wherein the conductor is electrically and directly connected to the buried layer through an inner bottom surface of the second trench.

10. The semiconductor device according to claim 9, further comprising:
    an isolation region formed between the semiconductor substrate and the epitaxial layer and connected to the first trench, wherein the buried layer and the isolation region 30: are of different conductivity types.

* * * * *